United States Patent
Katsura et al.

(10) Patent No.: US 8,221,918 B2
(45) Date of Patent: Jul. 17, 2012

(54) ANODE FOR LITHIUM ION SECONDARY BATTERY, PRODUCTION METHOD THEREOF, AND LITHIUM ION SECONDARY BATTERY USING THE SAME

(75) Inventors: Shoo Katsura, Kobe (JP); Jun Hisamoto, Kobe (JP); Toshiki Sato, Kobe (JP); Jun Suzuki, Kobe (JP); Shinichi Tanifuji, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 376 days.

(21) Appl. No.: 12/424,881

(22) Filed: Apr. 16, 2009

(65) Prior Publication Data

US 2009/0297951 A1    Dec. 3, 2009

(30) Foreign Application Priority Data

May 27, 2008 (JP) ................. 2008-138507
Jun. 10, 2008 (JP) ................. 2008-151495
Nov. 19, 2008 (JP) ................. 2008-295202
Feb. 17, 2009 (JP) ................. 2009-034540

(51) Int. Cl.
*H01M 4/13* (2010.01)
*H01M 4/36* (2006.01)
*B05D 5/12* (2006.01)

(52) U.S. Cl. ............ 429/231.8; 429/226; 427/78

(58) Field of Classification Search ............ 429/231.8; 427/78; 204/192.11
See application file for complete search history.

(56) References Cited

U.S. PATENT DOCUMENTS

| | | | |
|---|---|---|---|
| 6,436,578 B2 * | 8/2002 | Turner et al. | 429/231.95 |
| 2007/0104953 A1 * | 5/2007 | Sugita | 428/408 |
| 2008/0003418 A1 * | 1/2008 | Yamamoto et al. | 428/213 |
| 2008/0286654 A1 * | 11/2008 | Sawa et al. | 429/231.8 |

FOREIGN PATENT DOCUMENTS

| | | |
|---|---|---|
| CN | 1761089 A | 4/2006 |
| JP | 2002-110151 | 4/2002 |
| JP | 2004-79463 | 3/2004 |
| JP | 2006-269361 | 10/2006 |
| JP | 2006-269362 | 10/2006 |

OTHER PUBLICATIONS

Chinese Office Action issued Jun. 22, 2011, in Patent Application No. 200910138977.9 (with English-language translation).

(Continued)

*Primary Examiner* — Patrick Ryan
*Assistant Examiner* — Muhammad Siddiquee
(74) *Attorney, Agent, or Firm* — Oblon, Spivak, McClelland, Maier & Neustadt, L.L.P.

(57) ABSTRACT

Disclosed is anode for use in a lithium ion secondary battery. The anode includes an anode current collector and an anode active material arranged thereon, in which the anode active material contains amorphous carbon and at least one metal dispersed in the amorphous carbon, and the at least one metal is selected from: 30 to 70 atomic percent of Si; and 1 to 40 atomic percent of Sn. The anode gives a lithium ion secondary battery that has a high charge/discharge capacity and is resistant to deterioration of its anode active material even after repetitive charge/discharge cycles.

17 Claims, 7 Drawing Sheets

OTHER PUBLICATIONS

Yong Wang, et al., "Tin Nanoparticle Loaded Graphite Anodes for Li-Ion Battery Applications", Journal of the Electrochemical Society, vol. 151, No. 11, 2004, pp. A1804-A1809.

M. Marcinek, et al., "Microwave plasma chemical vapor deposition of nano-structured Sn/C composite thin-film anodes for Li-ion batteries", Journal of Power Sources, vol. 173, No. 2, Nov. 15, 2007, pp. 965-971.

G. X. Wang, et al., "Graphite-Tin composites as anode materials for lithium-ion batteries", Journal of Power Sources, vol. 97-98, Jul. 2001, pp. 211-215.

* cited by examiner

ANODE FOR LITHIUM ION SECONDARY BATTERY, PRODUCTION METHOD THEREOF, AND LITHIUM ION SECONDARY BATTERY USING THE SAME

BACKGROUND OF THE INVENTION

1. Field of the Invention

The present invention relates to an anode for use in a lithium ion secondary battery, a method for producing the anode, and a lithium ion secondary battery using the anode.

2. Description of the Related Art

As portable appliances become smaller and have higher performance, secondary batteries for use therein are required to have a higher and higher energy density. Among them, lithium ion secondary batteries are being used as power supplies for the portable appliances, because they show a higher voltage and higher charge/discharge capacity (higher energy density) than nickel-cadmium secondary batteries and nickel-hydrogen secondary batteries.

Such lithium ion secondary batteries are each mainly composed of an anode (negative electrode); a cathode (positive electrode); a separator that insulates between these electrodes; an electrolytic solution that helps the charge transfer between the electrodes; and a battery housing that houses these components. The anode for use in a lithium ion secondary battery is composed of a copper foil or copper alloy foil as a current collector; and an anode active material coated on the current collector. Graphite carbonaceous materials are generally used as the anode active material. However, the discharge capacity of graphite carbonaceous materials reaches the theoretical upper limit (372 mAh/g), and demands have been made to develop anode active materials showing a higher discharge capacity and a higher charge capacity.

One approach to meeting these requirements involves the use of metals that can be alloyed with lithium, such as Si, Ge, Ag, In, Sn, and Pb, as anode active materials showing higher charge/discharge capacity. Typically, Japanese Unexamined Patent Application Publication (JP-A) No. 2002-110151 proposes an anode composed of a current collector and tin (Sn) deposited on the current collector through vapor deposition. This anode shows theoretical charge/discharge capacity of 993 mAh/g which is about 2.5 times that of the graphite carbonaceous material. The anode using Sn, however, suffers from a significantly decreased charge/discharge capacity after repetitive charge and discharge operations, because, during charge/discharge cycles of lithium ion (alloying of Sn with lithium and discharge of lithium), the anode repetitively expands and shrinks in its volume, and thereby the deposited tin film delaminates from the current collector to increase the electrical resistance, or the deposited Sn film itself cracks to increase the contact resistance between Sn film fractions.

To mitigate the volumetric change of the anode active material to thereby solve the above problem, for example, JP-A No. 2004-079463 and JP-A No. 2006-269361 propose anodes each composed of a current collector and an anode active material which is arranged thereon and is composed of an alloy of Sn and a metal that is not alloyed with lithium. JP-A No. 2006-269362 proposes an anode composed of an anode active material; a current collector; and an intermediate layer (diffusion-barrier layer) which is arranged between the anode active material and the current collector and which mitigates the volumetric change of the anode.

However, these known techniques have the following disadvantages. The anodes disclosed in JP-A No. 2004-079463, JP-A No. 2006-269361, and JP-A No. 2006-269362, if used in lithium ion secondary batteries, help to improve the cycle properties. Namely, the anode active materials do not undergo deterioration (delamination or falling off) and can maintain their charge/discharge capacity even after repetitive charge/discharge cycles. All these anodes, however, suffer from a decreased charge/discharge capacity after repetitive charge/discharge cycles, because Sn and the metal that is not alloyed with lithium undergo phase splitting in the anode active material during repetitive charge/discharge cycles, and this ultimately causes cubic expansion and shrinkage of Sn.

SUMMARY OF THE INVENTION

Under these circumstances, an object of the present invention is to provide an anode for use in a lithium ion secondary battery, which has a high charge/discharge capacity and which is improved in deterioration of its anode active material due to multiple charge/discharge cycles. Another object of the present invention is to provide a method for producing the anode; and a lithium ion secondary battery using the anode.

Specifically, according to an embodiment of the present invention, there is provided an anode for use in a lithium ion secondary battery. The anode includes an anode current collector; and an anode active material arranged on the anode current collector, in which the anode active material contains amorphous carbon; and at least one metal, and the at least one metal is dispersed in the amorphous carbon and is selected from the group comprised of 30 to 70 atomic percent of silicon (Si) and 1 to 40 atomic percent of tin (Sn).

By using the specific metal(s) as a metal component to be contained in an anode active material according to the above configuration, the metal disperses in amorphous carbon without alloying with carbon. The volumetric change of the specific metal dispersed in the amorphous carbon in the anode active material is then suppressed by the action of the $sp^3$ bond in the crystal structure of amorphous carbon. The anode therefore shows a higher charge/discharge capacity (capacity per weight or capacity per volume) and has improved cycle properties.

There is provided, according to another embodiment of the present invention, a method for producing the anode. The method includes the steps of preparing an anode current collector; and depositing a film of an anode active material on the anode current collector through a vapor deposition process, in which the anode active material contains amorphous carbon and at least one metal, and the at least one metal is dispersed in the amorphous carbon and is selected from the group comprised of 30 to 70 atomic percent of Si and 1 to 40 atomic percent of Sn.

This method using a vapor deposition process allows the specific metal to disperse in amorphous carbon efficiently. The method further enables easy control of the compositions of the amorphous carbon and specific metal and easy control of the thickness of a film of the anode active material. Thus, a film of the anode active material can be easily and conveniently deposited on the anode current collector.

In a preferred embodiment, the amorphous carbon in the anode active material is deposited through arc ion plating using a graphite target.

The production method according to this embodiment enables a high deposition rate and thereby gives a film having a larger thickness and containing a larger amount of graphite structures. The resulting anode is thereby more likely to occlude lithium.

According to another embodiment of the present invention, there is provided a lithium ion secondary battery using the above-mentioned anode.

The lithium ion secondary battery having this configuration and using the anode according to the present invention has a high charge/discharge capacity and shows superior cycle properties.

The anode for use in a lithium ion secondary battery, according to the present invention, enables the production of a lithium ion secondary battery that has a high charge/discharge capacity and shows superior cycle properties, in which its anode active material is protected from deterioration due to multiple charge/discharge cycles.

The method for producing the anode for use in a lithium ion secondary battery, according to the present invention, allows at least one metal selected from the group comprised of 30 to 70 atomic percent of Si and 1 to 40 atomic percent of Sn to disperse in amorphous carbon in an anode active material. The method further enables easy control of the compositions of the amorphous carbon and specific metal and easy control of the thickness of a film of the anode active material. Thus, a film of the anode active material can be easily and conveniently deposited on the anode current collector.

By using arc ion plating with a graphite target to deposit the amorphous carbon, the resulting film of anode active material can have a larger thickness and is more likely to occlude lithium.

The lithium ion secondary battery according to the present invention has a high charge/discharge capacity and shows superior cycle properties.

DETAILED DESCRIPTION OF THE PREFERRED EMBODIMENTS

Next, anodes for use in lithium ion secondary batteries, methods for producing the anodes, and lithium ion secondary batteries using the anodes, all according to embodiments of the present invention, will be illustrated below with reference to the attached drawings. All numbers are herein assumed to be modified by the term "about."

Anode For Use in Lithium Ion Secondary Battery

Figure 1:
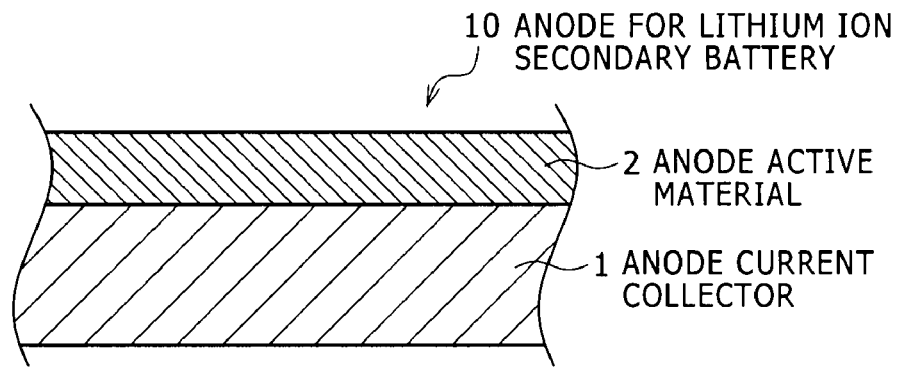
FIG. 1 is a cross-sectional view schematically showing the structure of an anode for a lithium ion secondary, according to an embodiment of the present invention.

With reference to FIG. 1, an anode for use in a lithium ion secondary battery (hereinafter also simply referred to as an "anode") 10 according to an embodiment of the present invention includes an anode current collector 1 and an anode active material 2 arranged on the anode current collector 1. The anode active material 2 contains amorphous carbon and at least one metal which is dispersed in the amorphous carbon and selected from the group comprised of 30 to 70 atomic percent of Si and 1 to 40 atomic percent of Sn (hereinafter also simply referred to as a "metal component").

The respective components will be illustrated below.

Anode Current Collector

A material constituting the anode current collector 1 should have such mechanical properties as to endure the stress caused by the anode active material 2 to expand. A material, if showing a large elongation, i.e., if easily plastically deforming and having a small proof stress, will elongate and plastically deform with the expansion of the anode active material 2 and will be, for example, wrinkled or folded. For these reasons, the material constituting the anode current collector 1 is generally a metal such as copper, a copper alloy, nickel, or stainless steel. Among these metals, preferred is a copper foil or copper alloy foil having a large proof stress and showing a fracture elongation of about 2% or less, because it easily gives a thin film and is inexpensively available. The higher the tensile strength of the material, the better, and the tensile strength is preferably 700 N/mm$^2$ or more. From this point, a rolled copper alloy foil is more preferred than an electrolytic copper foil. Exemplary copper alloy foils having such high strength include foils using so-called Corson copper alloys containing Ni and Si.

The thickness of the anode current collector 1 is preferably from 1 to 50 μm. The anode current collector 1, if having a thickness of smaller than 1 μm, may not endure the stress upon the formation of the anode active material 2 thereon and may thereby suffer from cutting or cracking. In contrast, the anode current collector 1, if having a thickness of larger than 50 μm, may increase the production cost and may increase the size of the battery. The thickness is more preferably from 5 to 20 μm.

Anode Active Material

Amorphous Carbon

Amorphous carbon has carbon sp$^2$ and sp$^3$ bonds and shows a crystalline structure such as a diamond-like carbon structure. The carbon sp$^3$ bond in the structure acts to suppress or mitigate the volumetric change of the metal component dispersed in the amorphous carbon during charge and discharge. For a higher charge/discharge capacity, the amorphous carbon preferably has such a structure capable of occluding lithium, such as a graphite structure.

Metal Component

The metal component is composed of at least one metal selected from the group comprised of 30 to 70 atomic percent of Si and 1 to 40 atomic percent of Sn.

The metal component includes a metal or metals which can be alloyed with lithium and have low melting points and can thereby disperse into the amorphous carbon without being alloyed with carbon that has a high melting point.

By dispersing (like as nanoclusters) at least one metal selected from the group comprised of 30 to 70 atomic percent of Si and 1 to 40 atomic percent of Sn in the amorphous carbon, the anode 10 has a higher charge/discharge capacity (capacity per weight or capacity per volume) and does not suffer from deterioration in cycle properties, as compared with an anode including an anode current collector and a coat of graphite applied on the anode current collector. Exemplary metals that work to increase the capacity per weight include Si and Sn, and exemplary metals that work to increase the capacity per volume include Si, Ag, In, Sn, and Bi.

The content of Si, when incorporated as the metal component in the anode active material 2, is 30 to 70 atomic percent. The incorporation of Si helps to improve the charge/discharge capacity and cycle properties, and, in addition, the incorporation of Si in an amount within the above-specified range provides a further increased charge/discharge capacity and gives good cycle properties even after repetitive charge and discharge operations, because the volumetric change of Si is satisfactorily mitigated by the action of carbon matrix. Silicon, if incorporated in a content of smaller than 30 atomic percent, may not effectively help to increase the charge/discharge capacity. For a further higher charge/discharge capacity, the Si content is preferably 35 atomic percent or more, and more preferably 40 atomic percent or more. In contrast, the volumetric change of Si, if incorporated in a content of larger than 70 atomic percent, may not be sufficiently mitigated by the action of carbon matrix, and the resulting anode active material may show significantly decreased cycle properties due to the collapse of the film structure, although it shows a high initial charge/discharge capacity. For further better cycle properties, the Si content is preferably 65 atomic percent or less, and more preferably 60 atomic percent or less.

The content of Sn, if incorporated as the metal component in the anode active material 2, is 1 to 40 atomic percent. The incorporation of Sn helps to improve the charge/discharge capacity and cycle properties, and, in addition, the incorporation of Sn in an amount within the above-specified range provides a further increased charge/discharge capacity and gives good cycle properties even after repetitive charge and discharge operations, because the volumetric change of Sn is satisfactorily mitigated by the action of carbon matrix. Tin, if incorporated in a content of smaller than 1 atomic percent, may not help to effectively increase the charge/discharge capacity. For a further higher charge/discharge capacity, the Sn content is preferably 5 atomic percent or more, and more preferably 10 atomic percent or more. In contrast, the volumetric change of Sn, if incorporated in a content of larger than 40 atomic percent, may not be sufficiently mitigated by the action of carbon matrix, and the resulting anode active material may have significantly decreased cycle properties due to the collapse of the film structure, although it shows a high initial charge/discharge capacity. For further better cycle properties, the Sn content is preferably 35 atomic percent or less, and more preferably 30 atomic percent or less.

The particle diameter of the metal component dispersed in the amorphous carbon is preferably 0.5 to 100 nm. By dispersing the metal component (i.e., at least one metal selected from the group comprised of 30 to 70 atomic percent of Si and 1 to 40 atomic percent of Sn) as nanoclusters having a particle diameter of 0.5 to 100 nm, the volumetric change of the metal component during charge and discharge operations can be further mitigated.

The particle diameter of the metal component may be controlled by adjusting the compositions of carbon and the metal component in the anode active material 2. The compositions can be controlled by adjusting conditions of the deposition of the anode active material 2 on the anode current collector 1. The particle diameter of the metal component can be measured or determined based on the half width of diffraction line intensity as observed through FIB-TEM or through thin-film X-ray diffractometry. The composition of the metal component can be analyzed through Auger electron spectrometry (AES).

Method For Producing Anode For Use in Lithium Ion Secondary Battery

An anode 10 according to an embodiment of the present invention may be produced by a method which includes the steps of: preparing an anode current collector 1; and depositing a film of an anode active material 2 on the anode current collector 1 through a vapor deposition process, in which the anode active material 2 contains amorphous carbon and at least one metal which is dispersed in the amorphous carbon and is selected from the group comprised of 30 to 70 atomic percent of Si and 1 to 40 atomic percent of Sn.

The method for producing the anode 10 includes the step of preparing an anode current collector (anode current collector preparation step) and the step of depositing a film of an anode active material (anode active material deposition step). An anode current collector 1 is formed or prepared in the anode current collector preparation step, and an anode active material 2 is deposited on the anode current collector 1 through a vapor deposition process in the anode active material deposition step, in which the anode active material 2 contains amorphous carbon and at least one metal which is dispersed in the amorphous carbon and is selected from the group comprised of 30 to 70 atomic percent of Si and 1 to 40 atomic percent of Sn.

The respective steps will be illustrated below.

Anode Current Collector Preparation Step

The anode current collector preparation step is the step of forming or arranging an anode current collector 1. Specifically, it is the step of preparing an anode current collector 1 for the deposition of an anode active material 2. The anode current collector 1 can be any known anode current collector, as described above. Correction of distortion or warp of the anode current collector 1 and/or grinding of the anode current collector 1 may be conducted in the anode current collector preparation step.

Anode Active Material Deposition Step

The anode active material deposition step is the step of dispersing the metal component (at least one metal selected from the group comprised of 30 to 70 atomic percent of Si and 1 to 40 atomic percent of Sn) into amorphous carbon through a vapor deposition process, and whereby depositing a film of an anode active material 2 on the anode current collector 1, as a dispersion of the metal component in the amorphous carbon.

The use of such vapor deposition process enables the deposition of the anode active material 2 on the anode current collector 1 while finely dispersing the metal component (at least one metal selected from the group comprised of 30 to 70 atomic percent of Si and 1 to 40 atomic percent of Sn) as nanoclusters into the amorphous carbon. This technique enables also the arbitrary control of the compositions of the amorphous carbon and the metal component within wide ranges and enables easy control of the film thickness. Thus, it enables easy and convenient deposition of the anode active material 2 on the anode current collector 1.

The production method according to the present invention employs a vapor deposition process and thereby gives the anode 10 through vapor deposition (evaporation) of a film on the anode current collector 1, which film is composed of amorphous carbon and a metal component dispersed in the amorphous carbon. The production method thereby eliminates the need of several steps in known production methods, i.e., the step of applying a graphite carbon powder to an anode current collector; the step of drying the applied powder; and the step of pressing the applied and dried powder to the anode current collector so as to increase the density thereof.

Exemplary vapor deposition processes include chemical vapor deposition (CVD) processes and physical vapor deposition (PVD) processes. Exemplary chemical deposition processes include plasma CVD; and exemplary physical vapor deposition processes include vacuum deposition, sputtering, ion plating, arc ion plating (AIP), and laser ablation. In particular, when the deposited film should be thick, the deposition process should be one showing a high deposition rate, and arc ion plating is effective in this case. Typically, by conducting arc discharge with graphite as a target according to arc ion plating, the graphite evaporates as carbon atoms or ions by the action of heat of arc discharge and then deposits as amorphous carbon on the surface of the anode current collector. Further, according to arc ion plating using such graphite target, graphite microparticles of several micrometers to several tens of micrometers in size, in addition to the carbon atoms or ions, are emitted from the target surface upon arc discharge and deposit on the anode current collector. Thus, this technique can give a film having a larger amount of graphite structures than films deposited by sputtering or ion plating. The resulting film can occlude lithium in a larger amount. In a preferred embodiment, evaporation of Si and/or Sn through vacuum deposition or sputtering is carried out simultaneously with the deposition of the amorphous carbon film through arc ion plating, to give an amorphous carbon film containing dispersed Si and/or Sn (anode active material). In a further preferred embodiment, the discharge in arc ion plating is carried out while introducing a gaseous hydrocarbon such as methane or ethylene to further increase the deposition rate. This is because, the hydrocarbon gas is decomposed by arc discharge and deposits as an amorphous carbon film on the anode current collector.

Figure 2:
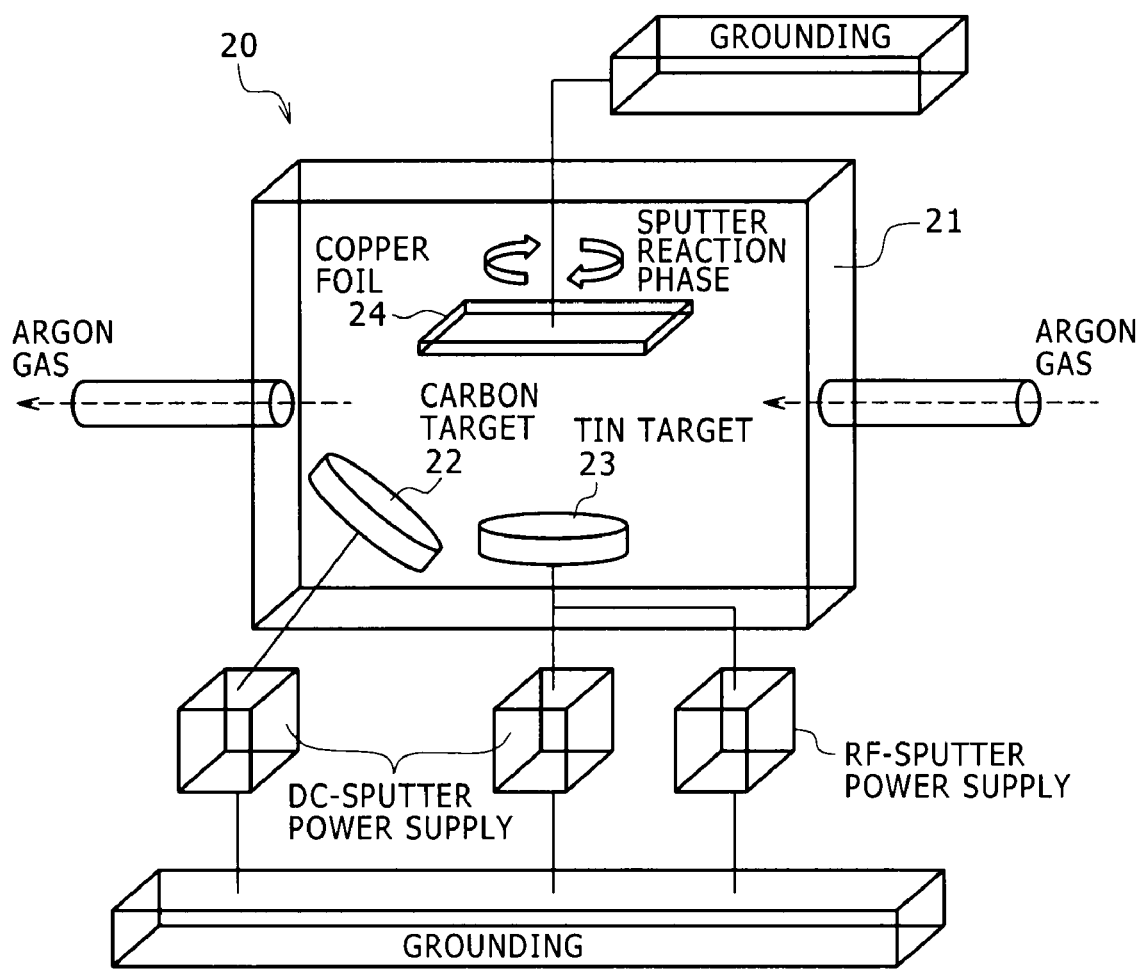
FIG. 2 is a schematic view of a sputtering system for the production of the anode for use in a lithium ion secondary battery.
Figure 3:
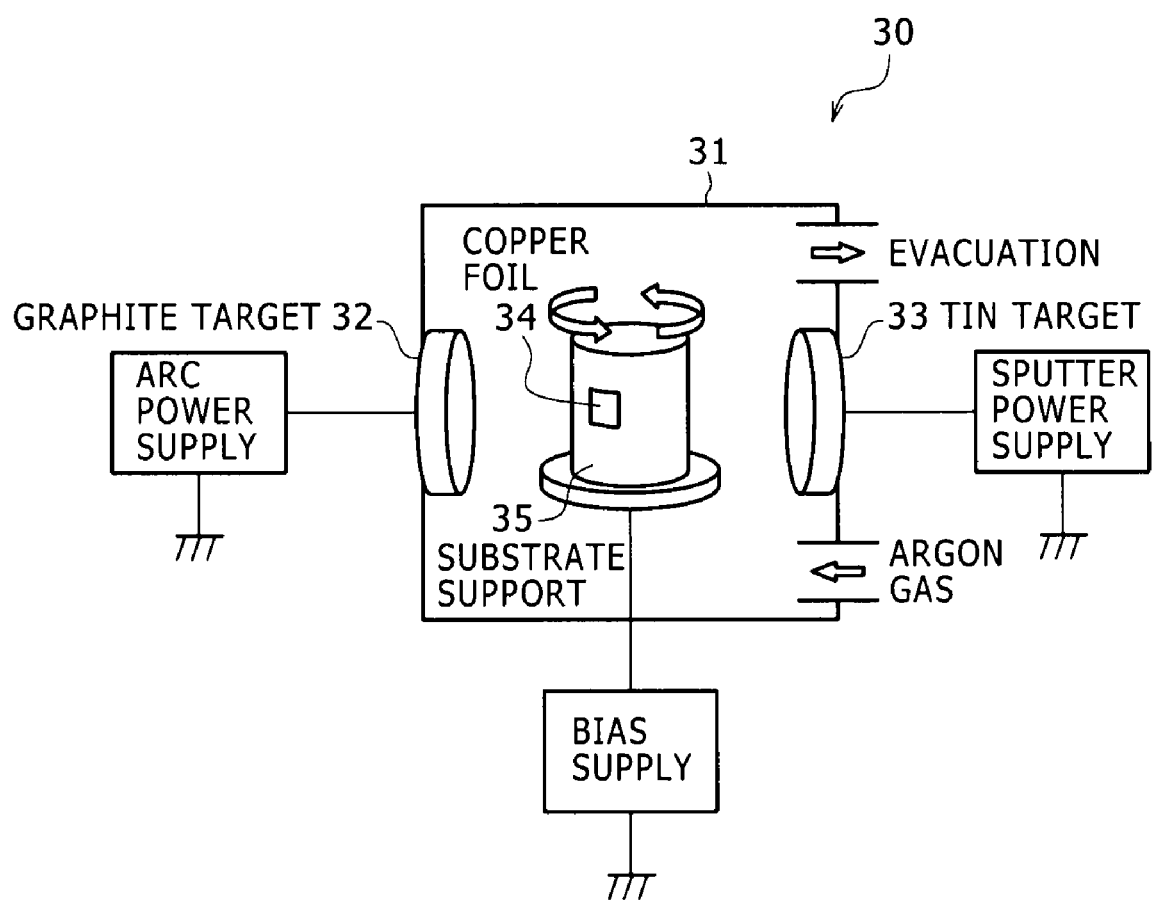
FIG. 3 is a schematic view of an arc ion plating (AIP)-sputtering composite system for the production of the anode for use in a lithium ion secondary battery.

Next, with reference to FIGS. 2 and 3, exemplary methods for producing the anode 10 using sputtering and arc ion plating, respectively, will be illustrated. However, the production method is not limited to these, as long as using a vapor deposition process. In these methods, Sn (tin) is used as the metal component, by way of example. The sputtering system and AIP-sputtering composite system to be used can be any known systems or devices, and their structures are not limited to those illustrated in FIGS. 2 and 3.

A production method employing sputtering as the vapor deposition process is illustrated in FIG. 2. Initially, a carbon target 22 and a tin target 23 each with a diameter of 100 mm and a thickness of 5 mm are arranged in a chamber 21 of a sputtering system 20; a copper foil 24 with a length of 50 mm, a width of 50 mm, and a thickness of 0.02 mm is also arranged in the chamber so as to face the carbon target 22 and the tin target 23, respectively; and the chamber 21 is evacuated to an inside pressure of $1 \times 10^{-3}$ Pa or less to thereby be in a vacuum state. Next, argon (Ar) gas is fed into the chamber 21 to an inside pressure of 0.26 Pa, and a direct-current (DC) voltage is applied to the carbon target 22 and tin target 23 to generate plasma so as to sputter the carbon target 22 and tin target 23. This allows the deposition of a film (anode active material) composed of amorphous carbon and, dispersed therein, tin on the copper foil 24. An anode for use in a lithium ion secondary battery can be produced in this manner.

Another production method employing arc ion plating as the vapor deposition process is illustrated in FIG. 3. Initially, a graphite target 32 with a diameter of 100 mm and a thickness of 16 mm, and a tin target 33 with a diameter of 6 inches and a thickness of 6 mm are arranged in a chamber 31 of an AIP-sputtering composite system 30, and a copper foil 34 with a length of 50 mm, a width of 50 mm, and a thickness of 0.02 mm is arranged on a cylindrical substrate support 35 that revolves; and the chamber 31 is evacuated to an inside pressure of $1 \times 10^{-1}$ Pa or less so as to be in a vacuum state. Next, argon (Ar) gas is fed into the chamber 31 to an inside pressure of the chamber of 0.26 Pa, and a direct current (DC) voltage is applied to the graphite target 32 and the tin target 33, respectively, to cause arc discharge of the graphite target 32 and glow discharge of the tin target 33. Thus, graphite is evaporated by heat of the arc discharge, and tin is evaporated by argon sputtering. This allows the deposition of a film (anode active material) composed of amorphous carbon and, dispersed therein, tin on the copper foil 34. An anode for use in a lithium ion secondary battery can be produced in this manner.

Methods according to embodiments of the present invention may further include any other steps between the above steps or before or after the steps, within ranges not adversely affecting the respective steps. Exemplary other steps include the step of cleansing the anode current collector and the step of adjusting the temperature.

Lithium Ion Secondary Batteries

Lithium ion secondary batteries according to embodiments of the present invention use any of the anodes for use in lithium ion secondary batteries. The anodes according to the present invention give lithium ion secondary batteries that have a high charge/discharge capacity and show superior cycle properties.

Forms of Lithium Ion Secondary Batteries

The lithium ion secondary batteries may have any form, as long as using the anodes. Exemplary forms include a cylindrical form, a coin-form, a substrate-mounted thin film form, a square form, and a seal form.

Each of the lithium ion secondary batteries mainly includes an anode; a cathode; a separator that insulates between these electrodes; an electrolytic solution that helps the charge transfer between these electrodes; and a battery housing that houses these components.

The respective components will be illustrated below.

Anode

The anode is the anode according to the present invention and is produced by the method according to the present invention.

Cathode

The cathode is not particularly limited and may use any known material such as $LiCoO_2$, $LiNiO_2$, $LiMn_2O_4$, and other lithium-containing oxides. The cathode may be produced by any known method not particularly limited. Typically, the cathode may be produced by mixing a powdery cathode material with a binder, and where necessary, an electroconductive material, a solvent, and other components; kneading the mixture thoroughly; applying the kneaded mixture to a current collector made typically of aluminum foil; and drying and pressing the applied layer.

Separator

The separator is also not particularly limited and may use a separator of any known material such as a porous sheet made from a polyolefin (e.g., a polyethylene or polypropylene), or a nonwoven fabric.

Electrolytic Solution

The electrolytic solution is fed into the battery housing and hermetically sealed therein. The electrolytic solution enables lithium ion to transfer upon charge and discharge, which lithium ion is formed through an electrochemical reaction.

A solvent for dissolving an electrolyte in the electrolytic solution may be a known aprotic, low-dielectric solvent that can dissolve a lithium salt therein. Exemplary usable solvents include ethylene carbonate, propylene carbonate, diethylene carbonate, dimethyl carbonate, methyl ethyl carbonate, acetonitrile, propionitrile, tetrahydrofuran, γ-butyrolactone, 2-methyltetrahydrofuran, 1,3-dioxolane, 4-methyl-1,3-dioxolane, 1,2-dimethoxyethane, 1,2-diethoxyethane, diethyl ether, sulfolane, methylsulfolane, nitromethane, N,N-dimethylformamide, and dimethyl sulfoxide. Each of different solvents may be used alone or in combination.

Exemplary lithium salts for use as the electrolyte in the electrolytic solution include $LiClO_4$, $LiAsF_6$, $LiPF_6$, $LiBF_4$, $LiB(C_6H_5)_4$, LiCl, $CH_3SO_3Li$, and $CF_3SO_3Li$. Each of different lithium salts may be used alone or in combination.

Battery Housing

The battery housing houses components such as the anode, cathode, separator, and electrolytic solution.

The anodes according to the present invention can be used also in solid-state lithium secondary batteries and lithium polymer secondary batteries. Specifically, the anodes, if used in the production of such secondary batteries together with a known cathode and a polymer electrolyte or solid-state electrolyte, give secondary batteries that have high safety and a high capacity.

EXAMPLES

Next, anodes for lithium ion secondary batteries, production methods thereof, and lithium ion secondary batteries, all according to the present invention, will be illustrated in further detail below, with comparisons between examples that satisfy the requirements in the present invention and comparative examples that do not satisfy the requirements.

First Experimental Example

Samples Nos. 1 to 4 were prepared by the following methods.

Sample No. 1

A carbon target and a tin target (both Furuuchi Chemical Corporation) each with a diameter of 100 mm and a thickness of 5 mm were placed in a chamber of a sputtering system as illustrated in FIG. 2; a copper foil (Furuuchi Chemical Corporation) with a length of 50 mm, a width of 50 mm, and a thickness of 0.02 mm was placed therein so as to face the carbon target and the tin target, respectively; and the chamber was evacuated to an inside pressure of $1 \times 10^{-3}$ Pa or less to thereby be in a vacuum state. Next, argon (Ar) gas was fed into the chamber to an inside pressure of the chamber of 0.26 Pa; a direct-current (DC) voltage was applied to the carbon target and tin target to generate plasma so as to sputter the carbon target and tin target. This allows the deposition of a film (anode active material) composed of amorphous carbon and, dispersed therein, tin on the copper foil. Thus, an anode for use in a lithium ion secondary battery was produced.

Figure 4:
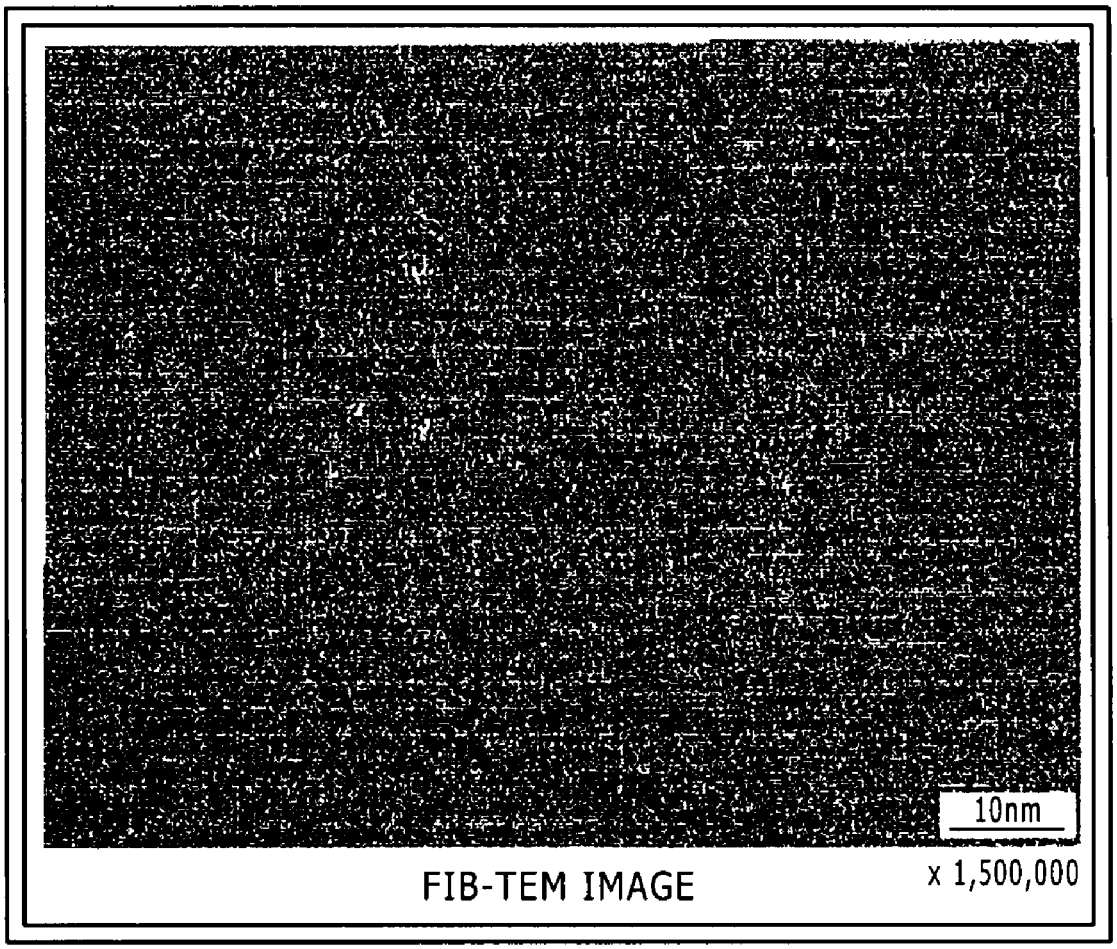
FIG. 4 is an image of the anode according to the present invention observed by focused ion beam-transmission electron microscopy (FIB-TEM)

How the metal component (tin) was dispersed in the amorphous carbon in the anode was determined through FIB-TEM observation. FIG. 4 is an image of the anode, according to the present invention, obtained through FIB-TEM observation.

With reference to FIG. 4, the FIB-TEM observation revealed that, in an observed structure, carbon had an amorphous phase, and tin particles of 2 to 5 nm particle diameter were dispersed in the amorphous carbon.

Sample No. 2

An anode for use in a lithium ion secondary battery was produced by the procedure and conditions as in the production of Sample No. 1, except that only a tin target (Furuuchi Chemical Corporation) with a diameter of 100 mm and a thickness of 5 mm was placed in the chamber; a DC voltage was applied only to an electrode to which the tin target was attached to generate plasma to sputter the tin target; and thereby tin alone deposited on the copper foil.

Sample No. 3

An anode for use in a lithium ion secondary battery was produced by the procedure and conditions as in the production of Sample No. 1, except that only a tin oxide (compositional formula: $SnO_2$) target with a diameter of 100 mm and a thickness of 5 mm was placed in the chamber; the power supply for the tin oxide target was replaced with a radio-frequency (RF) power supply; a radio-frequency voltage was applied onto to this electrode to sputter the tin oxide target to thereby deposit a film of tin oxide alone on the copper foil.

Sample No. 4

A graphite anode was produced by applying graphite with a binder to a copper foil; drying the applied film; and pressing the dried film.

The charge/discharge properties of produced Samples Nos. 1 to 4 were determined and evaluated according to the following technique.

Evaluation of Charge/Discharge Properties

Figure 5:
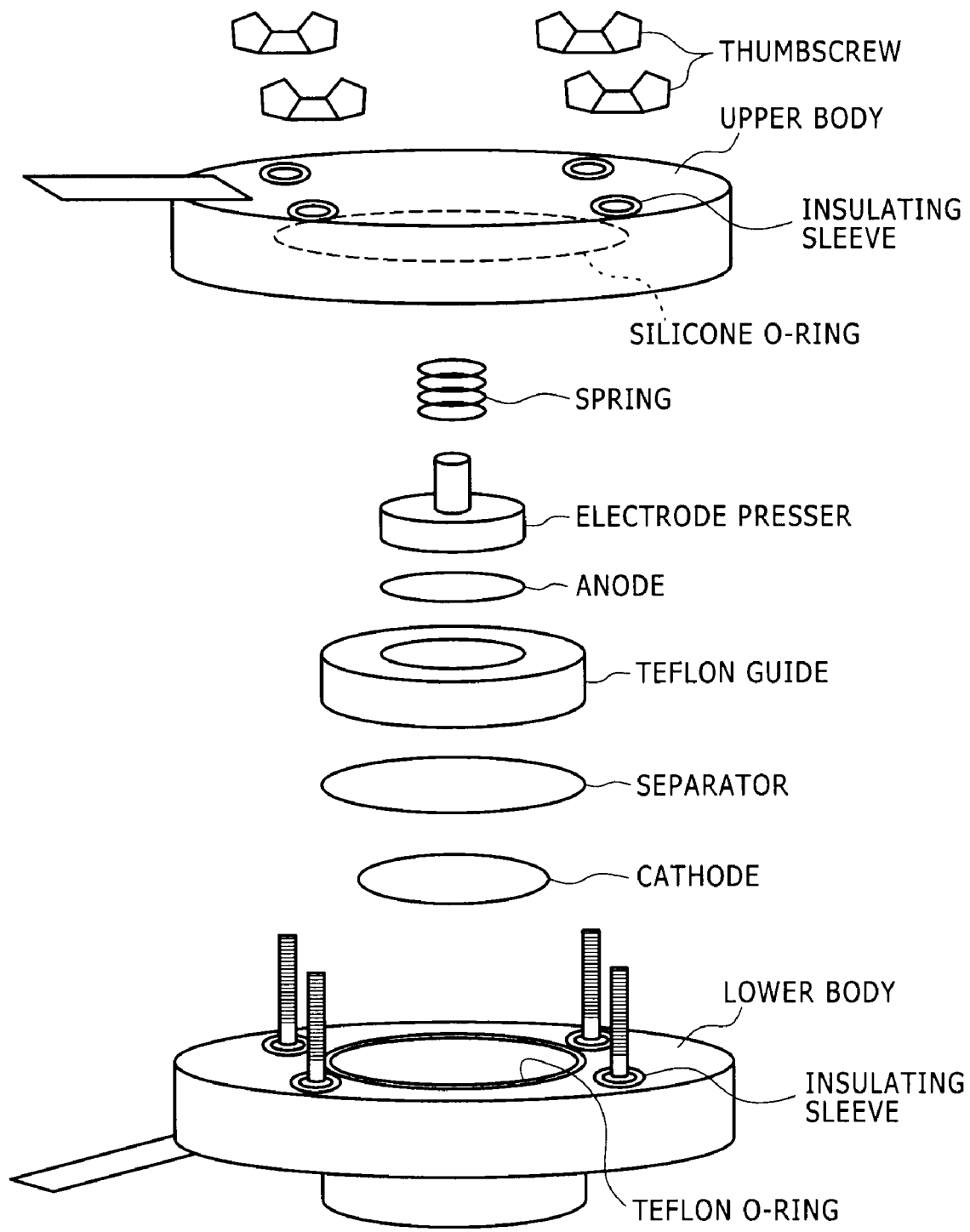
FIG. 5 is a schematic view showing the structure of a test cell used in Experimental Examples below.

A two-electrode test cell was prepared by mounting a sample anode (each of the above-produced anodes) and, as a counter electrode, metallic lithium; placing a porous polypropylene separator between the two electrodes; and injecting a solution as an electrolytic solution. The solution had been prepared by dissolving 1 mol/l of lithium hexafluorophosphate in an 1:1 (by volume) organic solvent mixture of ethylene carbonate and dimethyl carbonate. The structure of the test cell used herein is schematically illustrated in FIG. 5.

The test cell was subjected to 10 cycle of charge and discharge operations, in which one cycle of charge and discharge was conducted at room temperature at a charge/discharge rate of 0.2 C, a cutoff voltage upon charge of 0.005 V, and a cutoff voltage upon discharge of 1.2 V. A discharge capacity at the first cycle (initial discharge capacity) and a capacity maintenance percentage at the 10th cycle of the test cell were determined. The capacity maintenance percentage was determined according to the formula: (Discharge capacity at 10th cycle)/(Initial discharge capacity)×100.

The results are shown in Table 1. Samples Nos. 1 and 2 contain also tin oxide as their component, because tin exists also on the surface of anode, and the surface tin has been oxidized to give tin oxide. The contents (compositions) of tin in Samples Nos. 1 and 2 and of tin oxide in Sample No. 3 were each 35 atomic percent, and these contents were determined through Auger electron spectrometry (AES) as mentioned below.

TABLE 1

| Sample No. | Component of anode active material | Initial discharge capacity (mAh/g) | Capacity maintenance percentage at 10th cycle (%) |
|---|---|---|---|
| 1 | carbon, tin, tin oxide | 470 | 85 |
| 2 | tin, tin oxide | 720 | 30 |
| 3 | tin oxide | 560 | 65 |
| 4 | carbon | 270 | 85 |

As shown in Table 1, Sample No. 1 (Example) satisfies the requirements according to the present invention and shows a higher initial discharge capacity than Sample No. 4 (Comparative Example) which contains, as an anode active material, a coated film of graphite with a binder on a copper foil. Additionally, Sample No. 1 (Example) shows a higher capacity maintenance percentage than Samples Nos. 2 and 3 (Comparative Examples) which contain, as an anode active material, a deposited film of tin or tin oxide alone.

In contrast, Samples Nos. 2 and 3 (Comparative Examples) have a higher initial discharge capacity but a lower capacity maintenance percentage than Sample No. 4 which contains, as an anode active material, a coated film of graphite with a binder on a copper foil. Sample No. 4 (Comparative Example) has a high capacity maintenance percentage equivalent to that of Sample No. 1 (Example) but shows a lower initial discharge capacity than the other samples.

These results demonstrate that the anode including a current collector and a film, which film is composed of tin particles of 2 to 5 nm particle diameter dispersed in amorphous carbon, has a higher initial discharge capacity than the graphite anode and shows a higher capacity maintenance percentage at the 10th cycle of charge and discharge of lithium ion than the anodes composed of a film of tin or tin oxide arranged on a current collector.

Second Experimental Example

In Second Experimental Example, a series of anodes for use in lithium ion secondary batteries, containing tin (Sn) as the metal component and having varying Sn contents (compositions), was prepared.

Deposition Process

Samples Nos. 5 to 8 each having a film of tin and carbon mixture were produced by the procedure of Sample No. 1 in First Experimental Example. The Sn content was varied by controlling the output upon deposition.

Compositional Analysis

The Sn content was analyzed as element concentration in the film through Auger electron spectrometry (AES). The AES was conducted on a region of 10 μm diameter with the PHI 650 scanning Auger electron spectrometer (The Perkin-Elmer Corporation).

The charge/discharge properties of produced Samples Nos. 5 to 8 were determined and evaluated according to the following technique.

Evaluation of Charge/Discharge Properties

A two-electrode test cell was prepared by the procedure of First Experimental Example.

The test cell was subjected to 500 cycles of charge and discharge operations, in which one cycle of charge and discharge was conducted at room temperature at a charge/discharge rate of 1 C, a cutoff voltage upon charge of 0.005 V, and a cutoff voltage upon discharge of 1.2 V. A capacity maintenance percentage of the test cell at the 500th cycle was determined. The capacity maintenance percentage was determined according to the formula: (Discharge capacity at 500th cycle)/(Initial discharge capacity)×100. A sample having a capacity maintenance percentage of 75% or more was evaluated as "Accepted".

The results are shown in Table 2. How the capacity maintenance percentage at the 500th cycle varies depending on the Sn content is shown in FIG. 6.

TABLE 2

| Sample No. | Component of anode active material | Sn content (atomic percent) | Capacity maintenance percentage at 500th cycle (%) |
|---|---|---|---|
| 5 | carbon, tin, tin oxide | 5 | 85 |
| 6 | | 35 | 80 |
| 7 | | 50 | 10 |
| 8 | | 75 | 5 |

Figure 6:
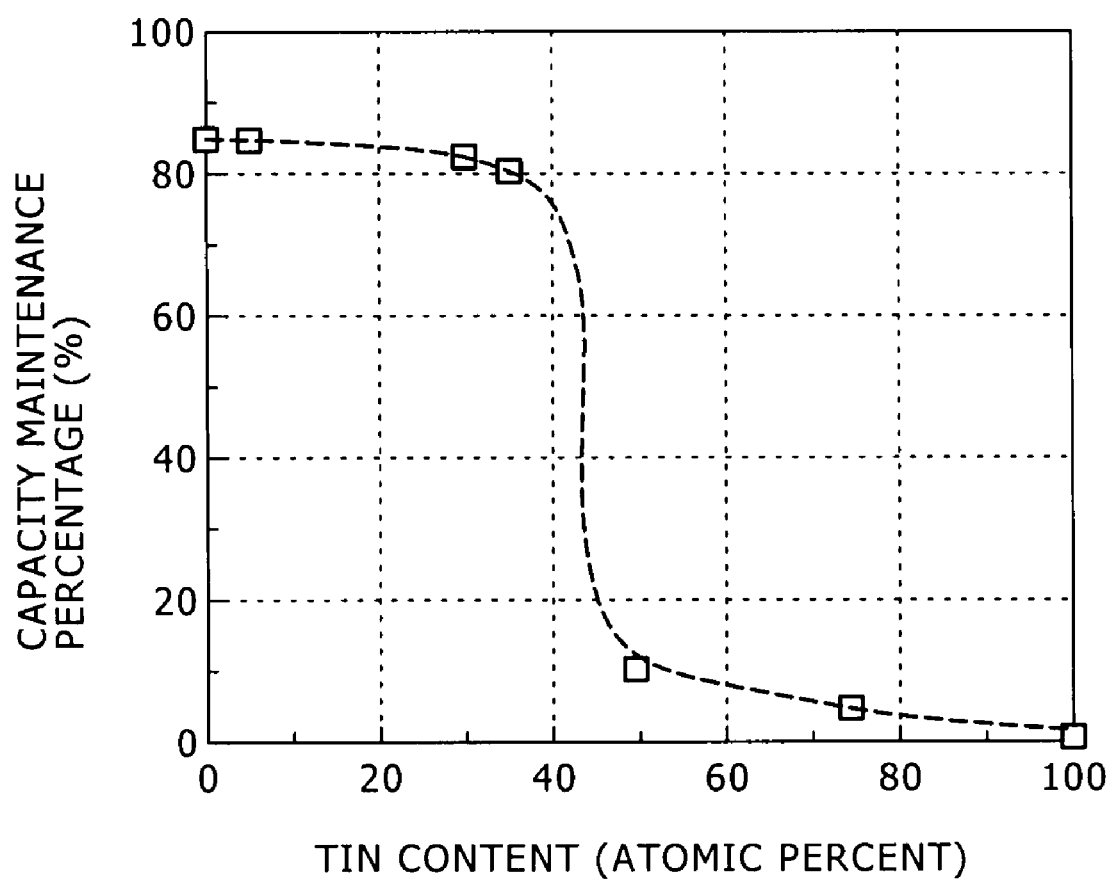
FIG. 6 is a graph showing how the capacity maintenance percentage at the 500th cycle varies depending on the Sn content in Experimental Example.

As shown in Table 2 and FIG. 6, Samples Nos. 5 and 6 (Examples) each have a Sn content within the range specified in the present invention and thereby show a high capacity maintenance percentage even at the 500th cycle. In contrast, Samples Nos. 7 and 8 (Comparative Examples) have a Sn content out of the range specified in the present invention and thereby show a significantly low capacity maintenance percentage at the 500th cycle.

Third Experimental Example

In Third Experimental Example, a series of anodes for use in lithium ion secondary batteries, containing silicon (Si) as the metal component and having varying Si contents (compositions) was prepared.

Deposition Process

Samples Nos. 9 to 15 each having a film of silicon and carbon mixture were produced with the sputtering system as in First Experimental Example, except for using, as targets to be arranged in the chamber, a carbon target (Furuuchi Chemical Corporation) and a silicon target (Kojundo Chemical Laboratory Co., Ltd.) each with a diameter of 101.6 mm and a thickness of 5 mm. The Si content (Si composition) was varied by controlling the output upon deposition. Above-prepared Sample No. 4 was also used as a comparative example.

Compositional Analysis

Figure 7:
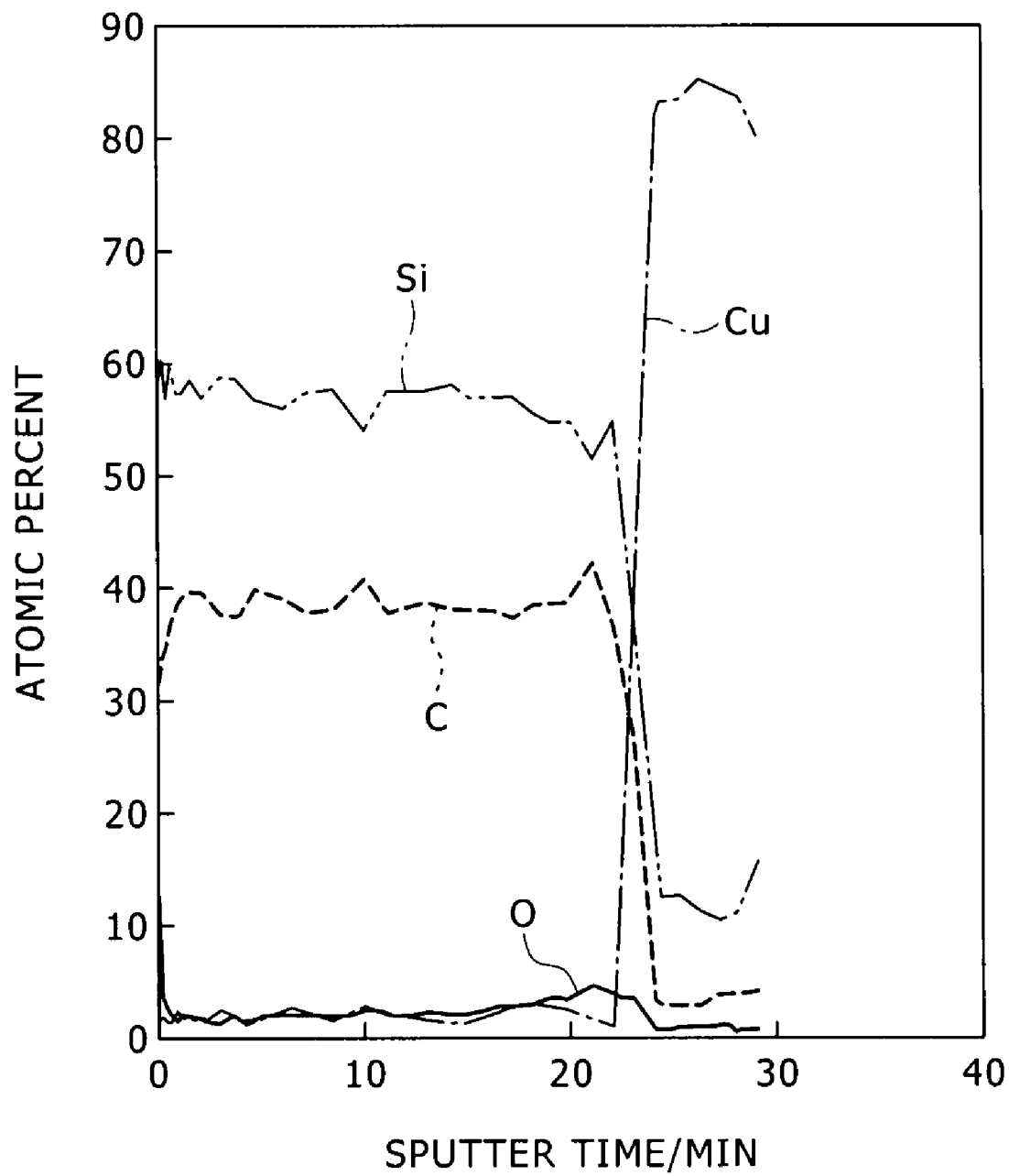
FIG. 7 is a graph showing how the chemical composition varies depending on the sputtering time as analyzed by Auger electron spectroscopy (AES) in Experimental Example.

The Si content was analyzed as element concentration in the film through Auger electron spectrometry (AES). The AES was conducted on a region of 10 μm diameter with the PHI 650 scanning Auger electron spectrometer (The Perkin-Elmer Corporation). A deposited sample film contained 10 atomic percent or less of inevitable impurities such as copper derived from the substrate, and oxygen, which had been contaminated inevitably upon deposition. To exclude these impurities, the Si content of the film was defined as: (Silicon atomic fraction)/[(Silicon atomic fraction)+(Carbon atomic fraction)]; and the carbon content of the film was defined as: (Carbon atomic fraction)/[(Silicon atomic fraction)+(Carbon atomic fraction)]. The result of analysis of Sample No. 10 through AES is shown in FIG. 7.

The charge/discharge properties of produced Samples Nos. 9 to 15, and Sample No. 4 were determined according to the following technique.

Evaluation of Charge/Discharge Properties

A two-electrode test cell was prepared by the procedure of First Experimental Example.

The test cell was subjected to 100 cycles of charge and discharge operations, in which one cycle of charge and discharge was conducted at room temperature at a charge/discharge rate of 1 C, a cutoff voltage upon charge of 0.01 V, and a cutoff voltage upon discharge of 2 V. A capacity maintenance percentage and a capacity at the 100th cycle (maintained capacity) of the test cell were determined. The capacity maintenance percentage was determined from the slope of a graph of the maintained capacity plotted against the number of charge/discharge cycles. A sample having a capacity maintenance percentage of 75% or more and a maintained capacity of 270 mAh/g or more was evaluated as "Accepted".

Figure 8:
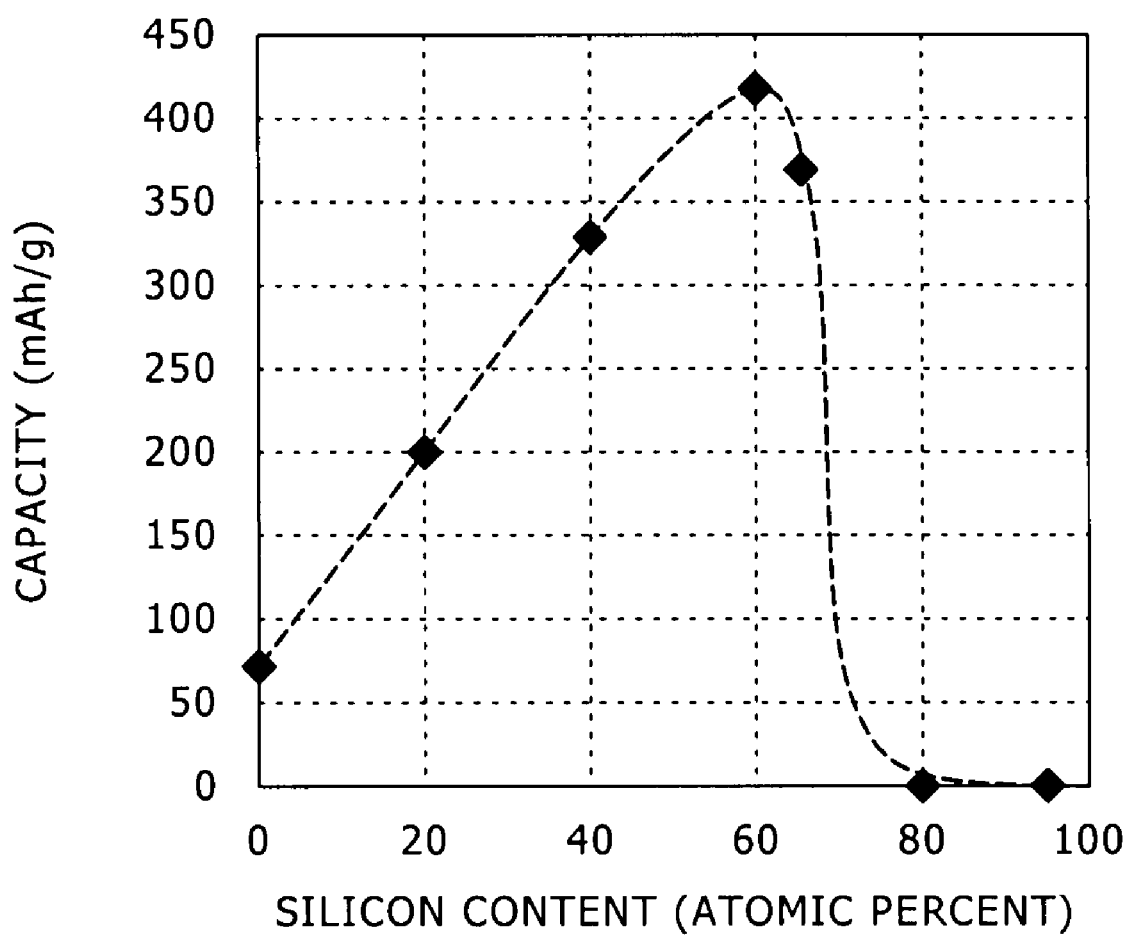
FIG. 8 is a graph showing how the maintained capacity at the 100th cycle varies depending on the Si content as determined in Experimental Example.

The results are shown in Table 3. How the maintained capacity at the 100th cycle varies depending on the Si content is shown in FIG. 8.

TABLE 3

| Sample No. | Component of anode active material | Silicon content (atomic percent) | Carbon content (atomic percent) | Capacity maintenance percentage at 100th cycle (%) | Capacity at 100th cycle (mAh/g) |
|---|---|---|---|---|---|
| 9 | carbon, | 40 | 60 | 80 | 330 |
| 10 | silicon | 60 | 40 | >100 | 420 |

TABLE 3-continued

| Sample No. | Component of anode active material | Silicon content (atomic percent) | Carbon content (atomic percent) | Capacity maintenance percentage at 100th cycle (%) | Capacity at 100th cycle (mAh/g) |
|---|---|---|---|---|---|
| 11 |  | 65 | 35 | 75 | 370 |
| 12 |  | 0 | 100 | 85 | 75 |
| 13 |  | 20 | 80 | 80 | 200 |
| 14 |  | 80 | 20 | <5 | <20 |
| 15 |  | 100 | 0 | <5 | <20 |
| 4 | carbon | 0 | 100 | 75 | 250 |

As shown in Table 3 and FIG. 8, Samples Nos. 9 to 11 (Examples) have a Si content within the range specified in the present invention and thereby show a higher capacity even at the 100th cycle than Sample No. 4 (Comparative Example) which includes a deposited film of graphite as the anode active material. In contrast, Samples Nos. 12 and 13 (Comparative Examples) have a Si content smaller than the lower limit of the specified range and thereby show a low capacity at the 100th cycle. Samples Nos. 14 and 15 (Comparative Examples) have a Si content larger than the upper limit of the specified range and thereby show both a low capacity maintenance percentage at the 100th cycle and a low capacity (maintained capacity) at the 100th cycle.

Fourth Experimental Example

In Fourth Experimental Example, an anode for a lithium ion battery was produced by simultaneously conducting deposition of amorphous carbon through arc ion plating and deposition of tin through sputtering.

A graphite target with a diameter of 100 mm and a thickness of 16 mm and a tin target (Kojundo Chemical Laboratory Co., Ltd., with a purity of 99.99 percent by mass) with a diameter of 6 inches and a thickness of 6 mm were arranged in a chamber of an AIP-sputtering composite system as illustrated in FIG. 3; a copper foil (Furuuchi Chemical Corporation) with a length of 50 mm, a width of 50 mm, and a thickness of 0.02 mm was mounted on the surface of a cylindrical substrate support that revolved; and the chamber was evaluated to an inside pressure of $1 \times 10^{-1}$ Pa or less so as to be in a vacuum state. Next, argon (Ar) gas was fed into the chamber to an inside pressure of the chamber of 0.26 Pa; a direct-current (DC) voltage was applied to the graphite target and the tin target, respectively, to cause arc discharge of the graphite target and glow discharge of the tin target. Thus, graphite was evaporated by the action of heat of arc discharge, while tin was evaporated by argon sputtering. This allowed the deposition of a film (anode active material) composed of amorphous carbon and, dispersed therein, tin on the copper foil. Thus, an anode for use in a lithium ion secondary battery was produced. The deposition was conducted for a period of 1 hour at an arc discharge current of 60 A, a sputtering power of 500 W, and a bias applied to the substrate of 0 V.

How tin was dispersed in amorphous carbon in the anode was determined through FIB-TEM observation to find that the carbon phase had a structure in which graphite of turbostratic structure was contained in an amorphous structure; and tin particles of 5 to 10 nm in particle diameter were dispersed in the carbon phase. The cross-section of the anode was observed with a scanning electron microscope (SEM) to find that the anode active material has a thickness of 5 μm. The Sn content was analyzed through Auger electron spectrometry (AES) by the procedure of Second Experimental Example and was found to be 3 atomic percent.

The charge/discharge properties of the sample produced in the above manner were determined by the procedure of Second Experimental Example, and an initial discharge capacity and a capacity maintenance percentage at the 500th cycle of charge and discharge operations were determined. The sample had an initial discharge capacity of 425 in Ah/g and a capacity maintenance percentage at the 500th cycle of 88%. These results demonstrate that the anode produced by simultaneous deposition of amorphous carbon through arc ion plating and tin through sputtering also shows a higher initial discharge capacity than Sample No. 4 (Comparative Example) containing, as the anode active material, a deposited film of graphite alone, and has a high capacity maintenance percentage of 75% or more.

These results demonstrate that the anodes according to the present invention can give lithium ion secondary batteries that have both a sufficient charge/discharge capacity and superior cycle properties.

While the present invention has been shown and described with reference to preferred embodiments and examples thereof, it should be understood that various changes and modifications are possible within the scope and spirit of the present invention, and it is intended to cover in the appended claims all such changes and modifications as fall within the true spirit and scope of the present invention.

What is claimed is:

1. An anode, comprising:
   an anode current collector; and
   an anode active material arranged on the anode current collector, wherein the anode active material comprises a mixture film comprising a carbon matrix and at least one nanocluster of at least one selected from the group consisting of (a) from 30 to 70 atomic percent of silicon (Si) and (b) from 1 to 40 atomic percent of tin (Sn), and wherein the carbon matrix is amorphous carbon having carbon $sp^2$ and $sp^3$ bonds; and the at least one nanocluster is dispersed in the carbon matrix.

2. A method for producing the anode of claim 1, the method comprising:
   depositing a film of the anode active material on the anode current collector through a vapor deposition process.

3. The method according to claim 2, further comprising depositing the amorphous carbon of the anode active material through arc ion plating with a graphite target.

4. A lithium ion secondary battery comprising the anode of claim 1.

5. The anode according to claim 1, wherein the anode contains no binder.

6. The anode according to claim 1, wherein the mixture film was produced by depositing a film of an anode active material on the anode current collector through a vapor deposition process.

7. The anode according to claim 1, wherein the mixture film was produced by depositing a film of an anode active material on the anode current collector through a vapor deposition process with a graphite target.

8. An anode comprising:
   an anode current collector; and
   an anode active material arranged on the anode current collector, wherein the anode active material comprises a mixture film including a carbon matrix and at least one nanocluster of at least one selected from the group consisting of (a) from 30 to 70 atomic percent of silicon (Si) and (b) from 5 to 40 atomic percent of tin (Sn), and wherein the carbon matrix is amorphous carbon having carbon $sp^2$ and $sp^3$ bonds; and the at least one nanocluster is dispersed in the carbon matrix.

9. The anode of claim 1, wherein the nanocluster comprises from 30 to 70 atomic percent of silicon (Si).

10. The anode of claim 1, wherein the nanocluster comprises from 1 to 40 atomic percent of tin (Sn).

11. The anode of claim 1, wherein the nanocluster comprises from 30 to 70 atomic percent of silicon (Si) and from 1 to 40 atomic percent of tin (Sn).

12. The method of claim 2, wherein the nanocluster comprises from 30 to 70 atomic percent of silicon (Si).

13. The method of claim 2, wherein the nanocluster comprises from 1 to 40 atomic percent of tin (Sn).

14. The method of claim 2, wherein the nanocluster comprises from 30 to 70 atomic percent of silicon (Si) and from 1 to 40 atomic percent of tin (Sn).

15. The anode of claim 8, wherein the nanocluster comprises from 30 to 70 atomic percent of silicon (Si).

16. The anode of claim 8, wherein the nanocluster comprises from 1 to 40 atomic percent of tin (Sn).

17. The anode of claim 8, wherein the nanocluster comprises from 30 to 70 atomic percent of silicon (Si) and from 1 to 40 atomic percent of tin (Sn).

* * * * *